United States Patent
Sakima

(10) Patent No.: US 7,481,230 B2
(45) Date of Patent: Jan. 27, 2009

(54) PLASMA PROCESSING METHOD AND APPARATUS

(75) Inventor: Hiromi Sakima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 682 days.

(21) Appl. No.: 10/715,859

(22) Filed: Nov. 19, 2003

(65) Prior Publication Data

US 2004/0099634 A1    May 27, 2004

(30) Foreign Application Priority Data

Nov. 20, 2002   (JP) ............................. 2002-336041

(51) Int. Cl.
*C25F 3/02*   (2006.01)
(52) U.S. Cl. .................... 134/1.1; 134/1.2; 134/22.1; 134/22.18; 134/902; 438/905; 216/79
(58) Field of Classification Search ............... 134/22.1, 134/22.18, 902, 1.1, 1.2; 438/905; 216/79
See application file for complete search history.

(56) References Cited

U.S. PATENT DOCUMENTS

| | | | | |
|---|---|---|---|---|
| 5,647,953 A | * | 7/1997 | Williams et al. | 134/1.1 |
| 5,679,211 A | * | 10/1997 | Huang | 438/697 |
| 5,728,602 A | * | 3/1998 | Bellows et al. | 438/14 |
| 5,746,928 A | * | 5/1998 | Yen et al. | 216/37 |
| 6,014,979 A | * | 1/2000 | Van Autryve et al. | 134/1.1 |
| 6,090,718 A | * | 7/2000 | Soga et al. | 438/714 |
| 6,136,211 A | * | 10/2000 | Qian et al. | 216/37 |
| 6,159,862 A | * | 12/2000 | Yamada et al. | 438/712 |
| 6,322,716 B1 | * | 11/2001 | Qiao et al. | 216/67 |
| 6,394,104 B1 | * | 5/2002 | Chen et al. | 134/1.1 |
| 6,566,270 B1 | * | 5/2003 | Liu et al. | 438/706 |
| 2001/0052350 A1 | * | 12/2001 | Chow et al. | 134/1.1 |
| 2002/0006674 A1 | * | 1/2002 | Ma et al. | 438/3 |

FOREIGN PATENT DOCUMENTS

| | | |
|---|---|---|
| JP | 5-291213 | 11/1993 |
| JP | 7-78802 | 3/1995 |

* cited by examiner

*Primary Examiner*—Sharidan Carrillo
(74) *Attorney, Agent, or Firm*—Oblon, Spivak, McClelland, Maier & Neustadt, P.C.

(57) ABSTRACT

A plasma processing method allows to suppress the drop of the etching rate of the depoless-process without performing an additional seasoning process right after the dry cleaning process. The method includes a first and a second plasma processing step carried out in a single chamber and a step of dry cleaning an inside of the chamber by using a dummy substrate between the first and the second plasma processing step. Deposits are substantially accumulated in the chamber during the first plasma processing step, while substantially no deposits are accumulated in the chamber during the second plasma processing step. The dry cleaning step is performed by supplying into the chamber a deposit removing gas for removing the deposits produced in the chamber during the first plasma processing step and a dummy substrate etching gas capable of etching the dummy substrate.

20 Claims, 15 Drawing Sheets

XPS ANALYSIS RESULT OF SURFACE OF $Y_2O_3$ CHIP

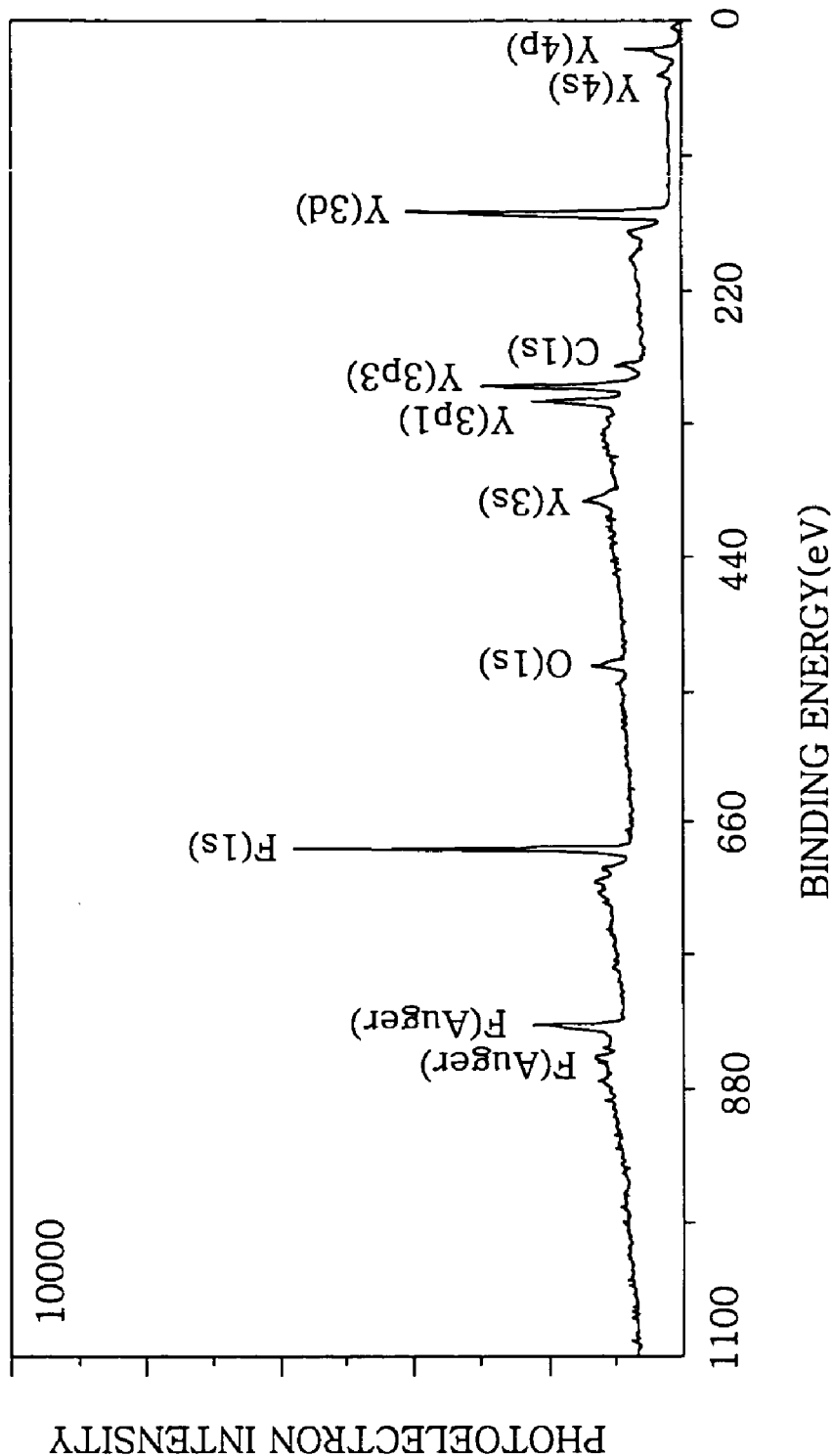

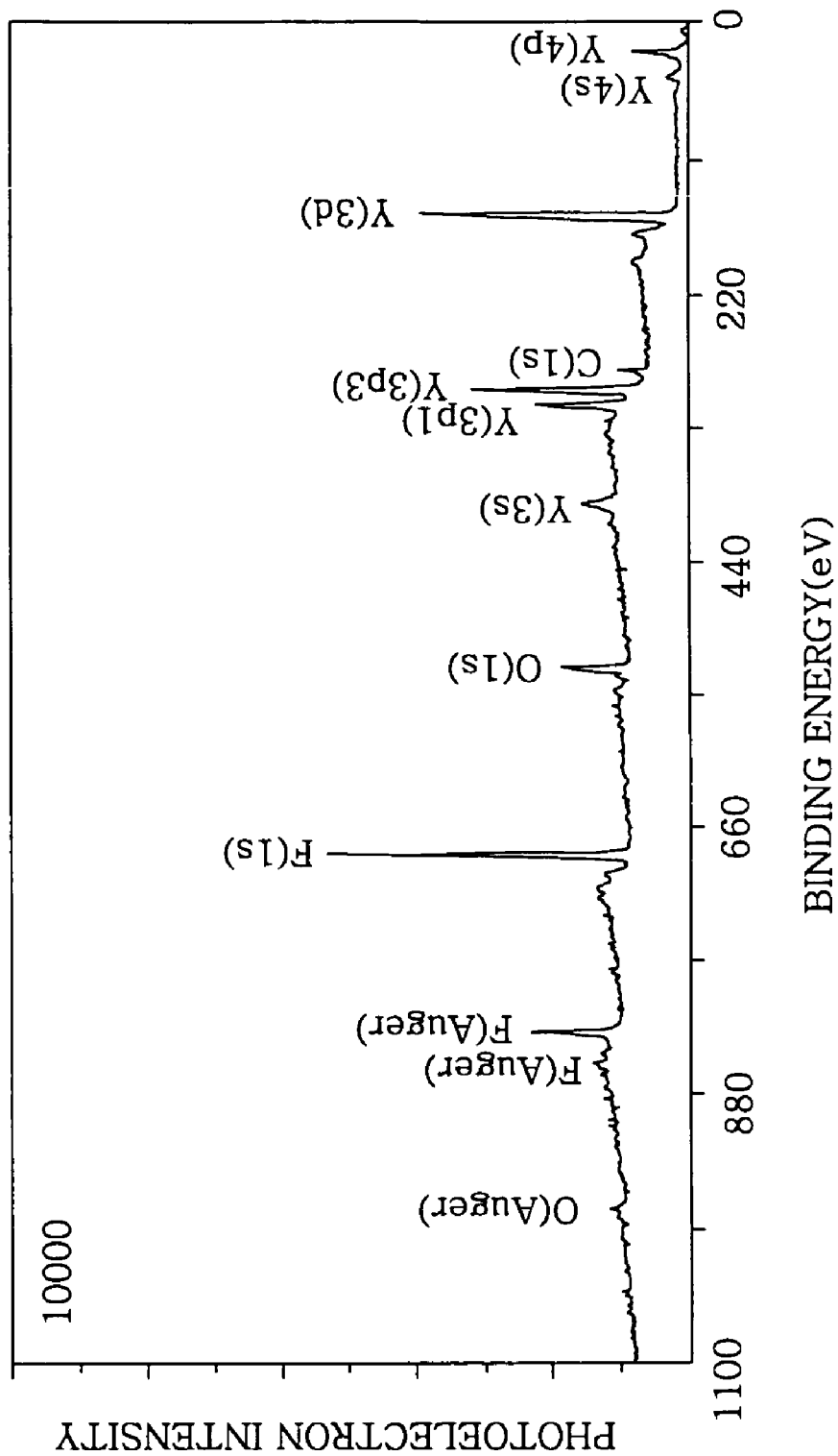

FIG. 10

| | ASHING RATE (Å/min) | |
|---|---|---|
| CF$_4$ FLOW RATE | 0 sccm | 2 sccm |
| ① CEILING PLATE 0mm(Center) | 7877 | 7598 |
| ② CEILING PLATE 50mm | 8398 | 7976 |
| ③ CEILING PLATE 95mm | 9304 | 9136 |
| ④ CEILING PLATE 140mm(Edge) | 8994 | 9387 |
| ⑤ DEPOSITION SHIELD 50mm(Top) | 8674 | 7615 |
| ⑥ DEPOSITION SHIELD 40mm | 10540 | 9896 |
| ⑦ DEPOSITION SHIELD 30mm | 8849 | 8285 |
| ⑧ DEPOSITION SHIELD 20mm | 10323 | 9696 |
| ⑨ DEPOSITION SHIELD 10mm(Bot) | 12260 | 11907 |
| ⑩ INSULATOR RING | 18295 | 17513 |
| ⑪ BAFFLE PLATE Center | 9524 | 9016 |
| ⑫ BAFFLE PLATE Middle | 12012 | 11701 |
| ⑬ BAFFLE PLATE Edge | 12152 | 11504 |
| Max. | 18295 | 17513 |
| Min. | 7877 | 7598 |
| Ave. | 10554 | 10095 |
| Unif. | 49.36 | 49.11 |

FIG.11

| | TIME REQUIRED TO REMOVE THE DEPOSIT (s) | | |
|---|---|---|---|
| APPLIED POWER | 500 W | 1000 W | 1500 W |
| ① CEILING PLATE 0mm(Center) | 551 | 351 | 254 |
| ② CEILING PLATE 50mm | 590 | 361 | 283 |
| ③ CEILING PLATE 95mm | 518 | 363 | 298 |
| ④ CEILING PLATE 140mm(Edge) | 312 | 257 | 234 |
| ⑤ DEPOSITION SHIELD 50mm(Top) | 0 | 0 | 0 |
| ⑥ DEPOSITION SHIELD 40mm | 0 | 0 | 0 |
| ⑦ DEPOSITION SHIELD 30mm | 26 | 20 | 17 |
| ⑧ DEPOSITION SHIELD 20mm | 146 | 113 | 95 |
| ⑨ DEPOSITION SHIELD 10mm(Bot) | 243 | 167 | 140 |
| ⑩ INSULATOR RING | 0 | 0 | 0 |
| ⑪ BAFFLE PLATE Center | 0 | 0 | 0 |
| ⑫ BAFFLE PLATE Middle | 184 | 120 | 102 |
| ⑬ BAFFLE PLATE Edge | 434 | 270 | 222 |
| Max. | 590 | 363 | 298 |
| Min. | 0 | 0 | 0 |
| Ave. | 231 | 156 | 127 |
| Unif. | 127.68 | 116.68 | 117.92 |

PLASMA PROCESSING METHOD AND APPARATUS

FIELD OF THE INVENTION

The present invention relates to a plasma processing method and apparatus; and, more particularly, to a method and apparatus for eliminating contaminants such as deposits accumulated on a wall surface and so on of a processing chamber during a plasma processing process.

BACKGROUND OF THE INVENTION

Foreign substances attached on a substrate such as a semiconductor wafer during a manufacturing process of a semiconductor device result in pattern defects in the device, thereby lowering a manufacturing yield. Accordingly, a process employing plasma, e.g., dry etching and CVD, in a manufacturing process has been widely studied recently. Specifically, a plasma reaction of various gases introduced into a manufacturing apparatus is used to carry out micro processing, e.g., film deposition and etching.

In such a process, deposits (a deposition film) may be attached on an inner wall of the manufacturing apparatus, in addition to an object being micro-processed. Since, for example, molecules of an etching gas may be decomposed or combined with each other in the plasma and etching by-products may be generated during the dry etching process, deposits thereof may be attached on the inner wall of the apparatus during the dry etching process. As the number of wafers treated increases, the deposits get thicker and are partially peeled off to generate dusts, which cause pattern defects in devices. Therefore, such deposits attached on the inner wall in the apparatus must be periodically removed.

If a depo-process is followed by a depoless-process in a same chamber while dry etching a silicon oxide film, an etching rate of the depoless-process becomes unstable, since the depoless-process can be easily influenced by deposits produced in the same chamber during the preceding depo-process. The term "depo-process" used herein denotes a process of using a gas with a smaller F/C (fluorine/carbon) ratio, e.g., $C_4F_8$, which leaves a visible amount of polymers including a CF based element such as $CF_4$ attached to the chamber. The term "depoless-process" used herein denotes a process using a gas with a larger F/C ratio, e.g., $CF_4$, which leaves no polymers attached to the chamber.

In order to solve the above problem, a gas reacting with the deposits is conventionally introduced to perform a dry cleaning process. Japanese Patent Laid-Open Publication No. 5-291213 discloses such a dry cleaning process scheme, wherein while a wafer installed on a supporting table is maintained at a temperature below 0° C., a process gas, i.e., a mixed gas of $CF_4$ and $O_2$, is introduced into a chamber so that the deposits may be removed by an activated process gas. Japanese Patent Laid-Open Publication No. 7-78802 discloses another dry cleaning process scheme, wherein a cleaning gas in which $H_2$ gas is added to $O_2$ gas is introduced to perform the dry cleaning process.

The gas used in the dry cleaning process reacts with the deposits of deposition film to be removed to produce compounds of high vapor pressures, so that the deposits are removed by an evaporation and vacuum exhaustion. Since a condition in the chamber just after the dry cleaning process is different from a stable condition in the chamber reached after repeatedly performing the depoless-process, the etching rate in the depoless-process decreases.

To solve the above problem, a seasoning process has been introduced. In the seasoning process, instead of processing the wafer right after the dry cleaning process, a plurality of dummy wafers are transferred into the chamber and a plasma processing is performed on the dummy wafers under exactly same process conditions as those of the actual plasma processing process to stabilize the process conditions in the chamber.

However, the seasoning process requires the dummy wafers for the seasoning process and at least several minutes of processing time. Accordingly, an additional effort and an additional time needed therefore lower an operating rate of a series of plasma processes.

SUMMARY OF THE INVENTION

It is, therefore, an object of the present invention to provide a plasma processing method and apparatus capable of preventing a decrease in an etching rate of the depoless-process without performing a seasoning process right after a dry cleaning process.

The inventor of the present invention rigorously conducted a series of experiments and found that decrease in the etching rate during the depoless-process right after the dry cleaning process results from silicon-containing substances sputtered from silicon-containing materials, e.g., a dummy wafer used in the dry cleaning process and a focus ring, and attached on the inner wall of the chamber. Further, the inventor found a dry cleaning process method that prevents such sputtered substances of wafer from being left attached on the inner wall of the chamber.

In accordance with a preferred embodiment of the present invention, there is provided a plasma processing method having a first and a second plasma processing step carried out in a single chamber, wherein deposits are substantially accumulated in the chamber during first plasma processing step and substantially no deposits are accumulated in the chamber during the second plasma processing step, the method comprising the step of:

dry cleaning an inside of the chamber by using a dummy substrate between the first and the second plasma processing step, wherein the dry cleaning step is performed by supplying into the chamber a deposit removing gas for removing the deposits produced in the chamber during the first plasma processing step and a dummy substrate etching gas capable of etching the dummy substrate.

Further, the deposit removing gas is preferably a gas capable of reacting with deposits of deposition film to be removed to produce compounds of high vapor pressures. Specifically, an oxygen gas, a nitrogen gas, a hydrogen gas, an ammonia gas or a combination thereof is used as the deposit removing gas.

Furthermore, the dummy substrate etching gas is preferably a gas capable of reacting with and etching the wafer, i.e., a CF-based gas, a CHF-based gas or a SF-based gas.

In accordance with another preferred embodiment of the present invention, there is provided a plasma processing method comprising the steps of:

performing a plasma processing on an object to be processed in a chamber;

after the step of performing the plasma processing, dry cleaning an inside of the chamber by using a dummy substrate, wherein the dry cleaning step is performed by supplying into the chamber a deposit removing gas for removing deposits produced in the chamber during the step of performing the plasma processing and a dummy substrate etching gas capable of etching the dummy substrate, and wherein a ratio of a flow rate of the dummy substrate etching gas to that of the deposit removing gas is not less than about 0.14% but not larger than about 7.1%.

Further, it is preferable that the high frequency power applied to one of the top and the bottom electrode during the step of performing the plasma processing ranges from about 3.18 W/cm$^2$ to about 4.78 W/cm$^2$.

Furthermore, it is preferable that the dry cleaning step is performed between a first and a second plasma processing step carried out in a same chamber, wherein deposits tend to be attached to the chamber during the first plasma processing step and deposits are not likely left attached to the chamber during the second plasma processing step.

Since a silicon containing material, e.g., silicon dioxide, is not going to be attached on the inner wall of the chamber during the dry cleaning process in accordance with the present invention, the decrease in the etching rate in the depoless-process carried out right after the dry cleaning process can be prevented and thus the seasoning process need not be performed right after the dry cleaning process. As a result, additional effort and time required for the seasoning process can be saved and the operating rate of a series of plasma processes can be enhanced.

BRIEF DESCRIPTION OF THE DRAWINGS

The above and other objects and features of the present invention will become apparent from the following description of preferred embodiments given in conjunction with the accompanying drawings, in which:

FIG. 5 depicts another XPS analysis on a surface of a chip of yttrium oxide to analyze deposits attached on the surface of the chip of yttrium oxide after the conventional dry cleaning process and a depoless-process;

FIG. 6 describes an XPS analysis on a surface of a chip of Yttrium oxide to analyze deposits attached on the surface of the chip of yttrium oxide after a dry cleaning process in accordance with a preferred embodiment of the present invention;

FIG. 10 is a table explaining a relationship between the presence of $CF_4$ added and an ashing rate (Å/min) at various locations in an experimental chamber;

FIG. 11 is a table for illustrating a relationship between a power applied to a bottom electrode and time (second) required to remove deposits attached to resist chips at various locations in the experimental chamber 300 after performing the depo-process on 25 wafers with processing time of 3 min/wafer;

DETAILED DESCRIPTION OF PREFERRED EMBODIMENTS

Figure 1:
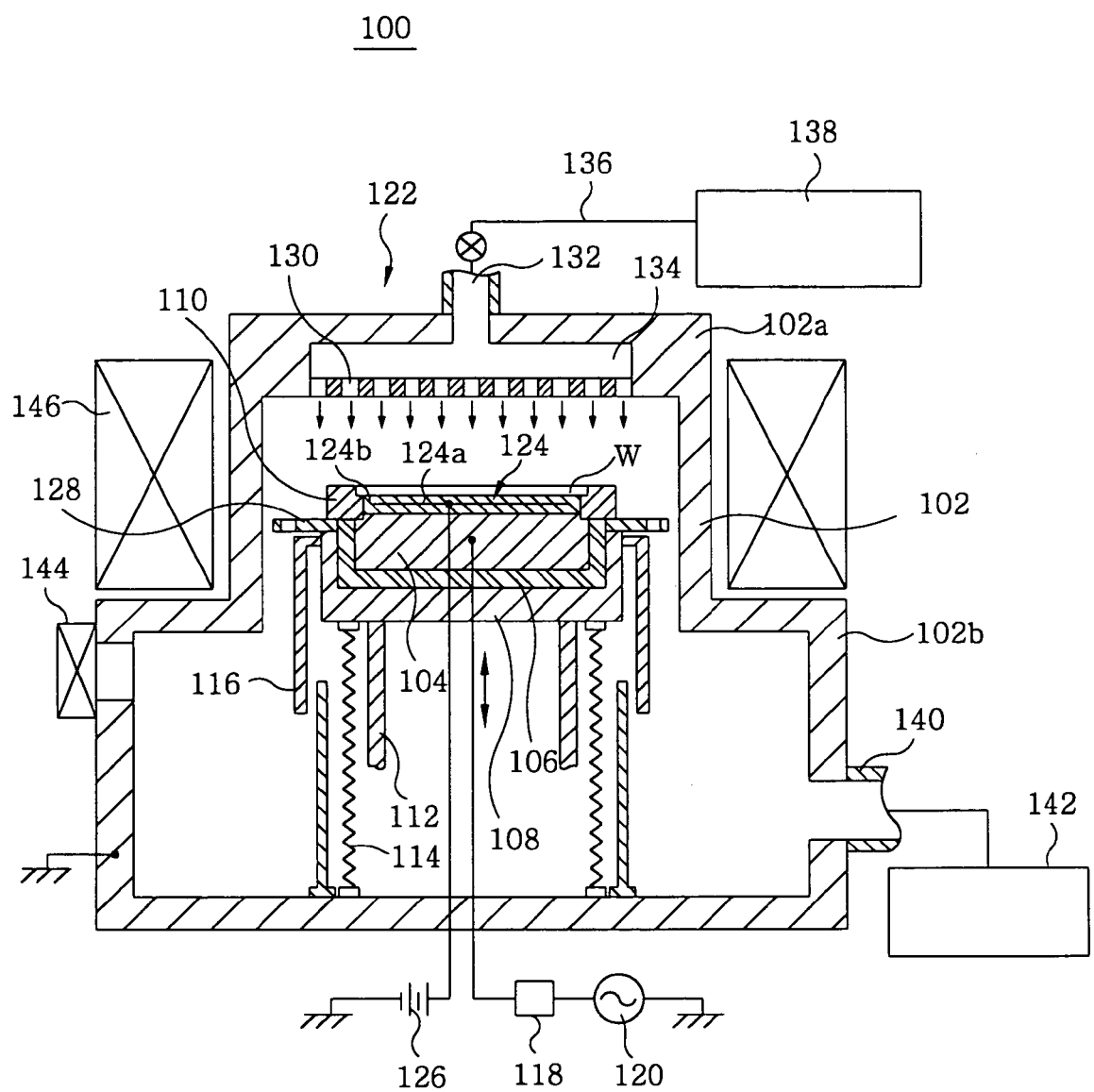
FIG. 1 shows a schematic cross sectional view of a plasma processing apparatus in accordance with a preferred embodiment of the present invention.
Figure 2A:
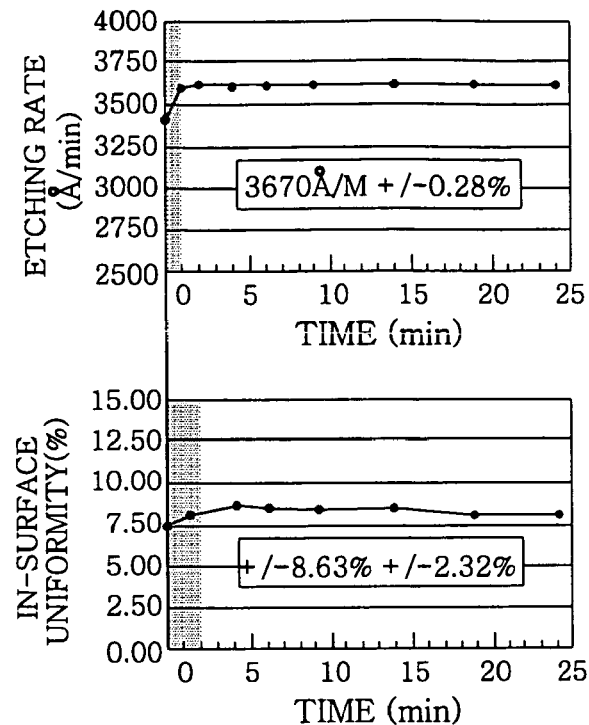
FIGS. 2A to 2D illustrate graphic illustration explaining variations of etching rate and in-surface uniformity during a depoless-process executed after a dry cleaning process in accordance with the present invention.
Figure 2B:
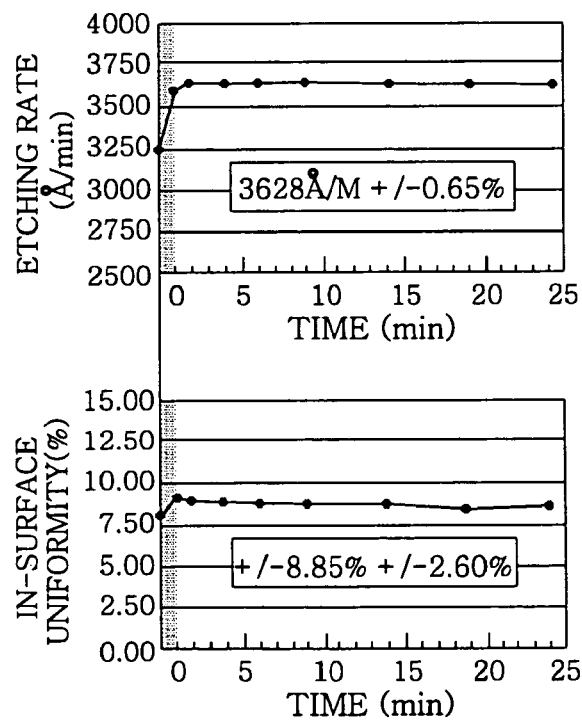
Figure 2C:
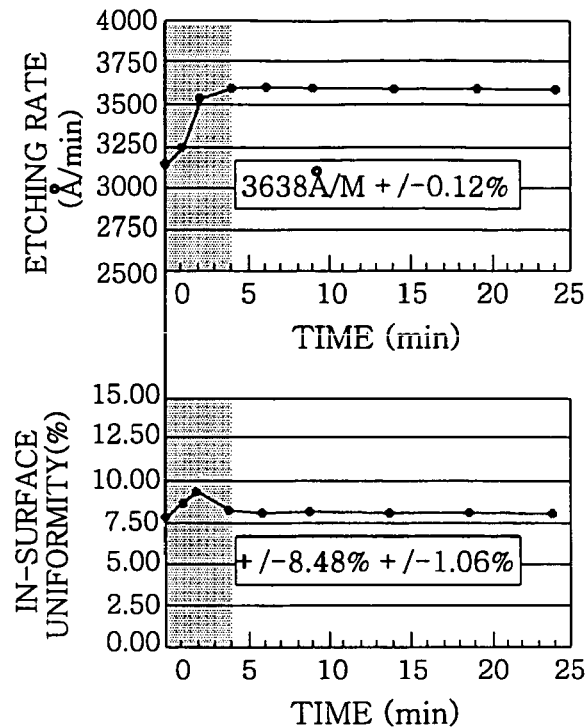
Figure 2D:
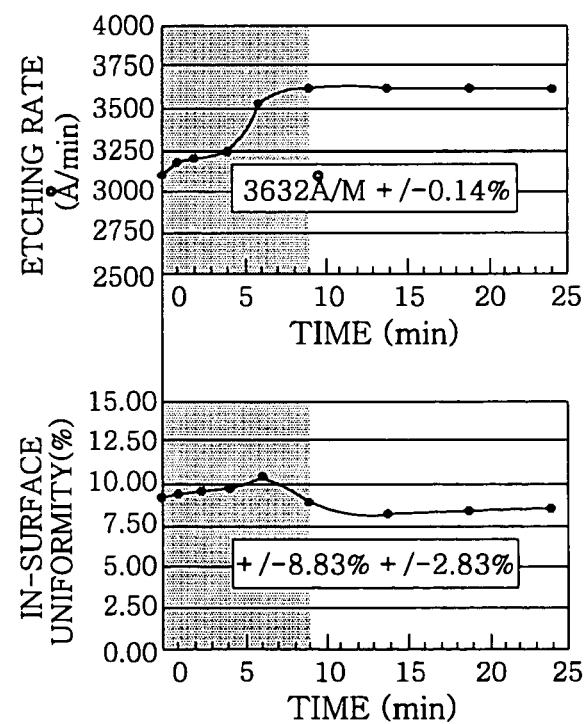

Hereinafter, a preferable embodiment of the present invention will be described in detail with reference to the accompanying drawings. In the specification and the drawings, parts whose functions and structures are substantially identical with each other will be assigned with a similar reference numeral to avoid redundant explanation.

FIG. 1 illustrates a cross sectional view of a plasma processing apparatus 100 in accordance with a first embodiment of the present invention. The plasma processing apparatus 100 has a sealed chamber 102. The chamber 102 is a stepped cylindrical chamber which has an upper part 102a with a smaller diameter and a lower part 102b with a larger diameter. The chamber 102 has a wall made of aluminum whose surface is coated with an yttrium oxide ($Y_2O_3$) film with a thickness of about 200 μm, for example. The chamber 102 is electrically grounded.

A supporting table 104 is installed in the chamber 102. The supporting table 104 horizontally supports an object to be processed, e.g., a semiconductor wafer W (referred to as a wafer, hereinafter) with a diameter of 200mm. The supporting table 104 is made of, e.g., Al and supported by a support 108 through an insulating plate 106. A focus ring 110 is disposed around an upper periphery of the supporting table 104. The focus ring 110 is made of a conductive material, e.g., single crystal silicon.

The supporting table 104 and the support 108 move upwards and downwards by a ball screw mechanism having ball screws 112. A bellows 114 made of stainless steel covers a driving portion under the support 108. A bellows cover 116 surrounds the bellows 114.

The supporting table 104 constituting a bottom electrode is coupled to an RF power supply 120 through a matching box 118. A 13.56 MHz high frequency power is applied from the RF power supply 120 to the supporting table 104, for example. Installed over the supporting table 104 is a shower head 122 constituting a top electrode. The supporting table 104 faces the shower head 122 in a parallel manner. The shower head 122 is grounded. The supporting table 104 (bottom electrode) and the shower head 122 (top electrode) serve as a pair of electrodes.

An electrostatic chuck 124 is installed on the supporting table 104 to attract the wafer W thereto with electrostatic force. The electrostatic chuck 124 includes an insulator 124b and an electrode 124a embedded therein. A power supply 126 is connected to the electrode 124a. With the application of a voltage from the power supply 126 to the electrode 124a, the wafer W is adhered to the electrostatic chuck 124 by a Coulomb force.

There is formed a coolant channel (not shown) inside the supporting table 104 through which an appropriate coolant to control the temperature of the supporting table 104 circulates. Further, a backgas supply structure (not shown) for supplying an inert gas, e.g., a He gas, to increase the thermal conductivity between the supporting table 104 and the wafer W is provided in the supporting table 104 and the electrostatic chuck 124. Heat is transferred between the supporting table 104 and the wafer W to maintain the wafer W at a required temperature. Installed outside of the focus ring 110 is a baffle plate 128. The baffle plate 128 is connected to the chamber 102 through the support 108 and the bellows 114.

Installed at a ceiling portion of the chamber 102 is the shower head 122 facing the supporting table 104. The shower head 122 has a plurality of gas inlet holes 130 in a bottom side thereof and a gas inlet 132 on a top side thereof. A space 134 is formed within the shower head 122. The gas inlet 132 is coupled with a gas supply line 136. Another end of the gas supply line 136 is connected to a process gas supply system 138 for supplying a process gas, which includes a reaction gas for plasma processing, e.g., etching, and a dilution gas. For example, as conventionally used in the prior art, a halogen gas may be used as the reaction gas while an Ar gas, a He gas and the like may be used as the dilution gas.

The process gas from the process gas supply system 138 is provided to the space 134 of the shower head 122 through the gas supply line 136 and the gas inlet 132, and then is injected from the gas inlet holes 130 to etch a film formed on the wafer W.

Installed at a sidewall in the lower part 102b of the chamber 102 is a gas outlet port 140. The gas outlet port 140 is connected to a gas pumping system 142. By operating a vacuum pump (not shown) installed in the gas pumping system 142, the chamber 102 may be depressurized to a certain vacuum level. Installed at a top sidewall of the lower part 102b is a gate valve 144 to open and close an opening for transferring the wafer W.

Concentrically arranged around the upper part 102a of the chamber 102 is a dipole ring magnet 146 as a means for generating a magnetic field in a region between the supporting table 104 and the shower head 122. The dipole ring magnet 146 is configured to be rotated by using a rotating unit (not shown), e.g., a motor.

In the plasma processing apparatus of the above-described configuration, the gate valve 144 is first opened to carry the wafer W in the chamber 102. The wafer W is mounted on the supporting table 104 and the gate valve 144 is closed. The supporting table 104 moves upwards to a position shown in FIG. 1 and the chamber 102 is exhausted through the gas outlet port 140 by the vacuum pump of the gas pumping device 142.

After the chamber 102 reaches to a required vacuum level, a certain process gas is introduced from the process gas supply system 138 to the chamber 102 so that the chamber 102 can be maintained at a given pressure, e.g., 40 mTorr. Then, a high frequency power with a frequency of, e.g., 13.56 MHz and a power of, e.g., 1000 to 5000 W is applied from the RF power supply 120 to the supporting table 104. At this time, a predetermined voltage is applied from the DC power supply 126 to the electrode 124a of the electrostatic chuck 124, so that the wafer W is attracted to be adhered to the electrostatic chuck 124 by the Coulomb force.

As the high frequency power is applied to the bottom electrode, i.e., the supporting table 104 as described above, an electric field is generated between the top electrode, i.e., the shower head 122, and the bottom electrode, i.e., the supporting table 104. Further, since the dipole ring magnet 146 generates a horizontal magnetic field at the upper part 102a of the chamber 102, a magnetron discharge due to electron drift is generated in a processing region where the wafer W is located, which in turn generates a plasma from the process gas so that a film formed on the wafer W can be etched away.

Hereinafter, variations of etching rate in a depoless-process carried out after the dry cleaning process will be described.

Referring to FIGS. 2A to 2D, there is shown a graphic illustration for describing variations in an etching rate and those in an in-surface uniformity of etching rate, i.e., a variation in the uniformity of etching rate within the surface, for cases where 25 wafers were processed by the depoless-process after the dry cleaning process. The vertical axes in graphs on the upper side represent an etching rate (Å/min); those on the lower side, an in-surface uniformity of etching rate (%); and the horizontal axes, an elapsed time (min) measured from the time of the termination of the dry cleaning process. The processing time of the depoless-process is about 1 minute per a wafer W and the number in the horizontal axis corresponds to the number of wafers processed by the depoless-process.

In FIGS. 2A to 2D, the processing durations for the dry cleaning process are 3, 5, 10 and 30 minutes, respectively.

Values shown in each graph denotes an average and a standard deviation of an etching rate or an in-surface uniformity after the etching rate or the in-surface uniformity during the depoless-process reaches a stable range. The stable ranges were determined based on the criteria that the etching rates and the in-surface uniformities respectively remain within ±1.0% and ±3.0% with respect to an average of the etching rates and an average of the in-surface uniformities after reaching their respective stable regions. The dotted portions in FIGS. 2A to 2D represent unstable regions.

An exemplary processing condition of the depoless-process for plasma-etching a thermal silicon oxide film formed all over the surface of the wafer, i.e., an object to be processed, with a diameter of 200mm is processed by plasma etching is as follows:

a pressure in the chamber; 45 mTorr, a high frequency power applied to the bottom electrode and time during which the high frequency power is applied; 1400 W and 1 minute, respectively, flow rates of $CF_4$, $O_2$ and Ar gases in a mixed gas thereof supplied as the process gas; 80 sccm, 20 sccm and 160 sccm, respectively, temperatures of the top electrode, the sidewall of the chamber and the bottom electrode; 60° C., 60° C. and 40° C., respectively, and pressure levels of the backgas (He); 7 Torr in a central region of the object to be processed and 40 Torr in a peripheral region thereof.

The 1st, 2nd, 3th, 5th, 7th, 10th, 15th, 20th and 25th processed wafers respectively had thermal silicon oxide layers formed thereon while the other wafers were dummy wafers with surfaces thereof coated with resist films, respectively.

An exemplary processing condition for the dry cleaning process were as follows:

a pressure in the chamber; 100 mTorr, a high frequency power applied to the bottom electrode and time during which the high frequency power is applied; 2000 W and 1 minute, respectively, a flow rate of $O_2$ gas supplied as the process gas; 700 sccm, temperatures of the top electrode, the sidewall of the chamber and the bottom electrode; 60° C., 60° C. and 40° C., respectively, and pressure levels of a backgas (He); 7 Torr in the central region of the object to be processed and 40 Torr in the peripheral region thereof. The silicon dummy wafers were used during the dry cleaning process.

The variations in the etching rate and those in the in-surface uniformity during the depoless-process after executing the dry cleaning process under the above condition will be described. As the dry cleaning process time increases from 3 minutes to 30 minutes, the etching rate decreases and the in-surface uniformity increases slightly at the time of the termination of the dry cleaning process. Further, as the dry cleaning process time increases from 3 minutes to 30 minutes, the time required for the etching rate and the in-surface uniformity to be stabilized from the time of the termination of the dry cleaning process increases from 1-2 minutes to 9 minutes. From the above results, it can be seen that the drop of the etching rate at the time of the termination of the dry cleaning process and the time required to reach a stable etching rate from the time of the termination of the dry cleaning process depend on the time duration during which the dry cleaning process is performed.

Figure 3:
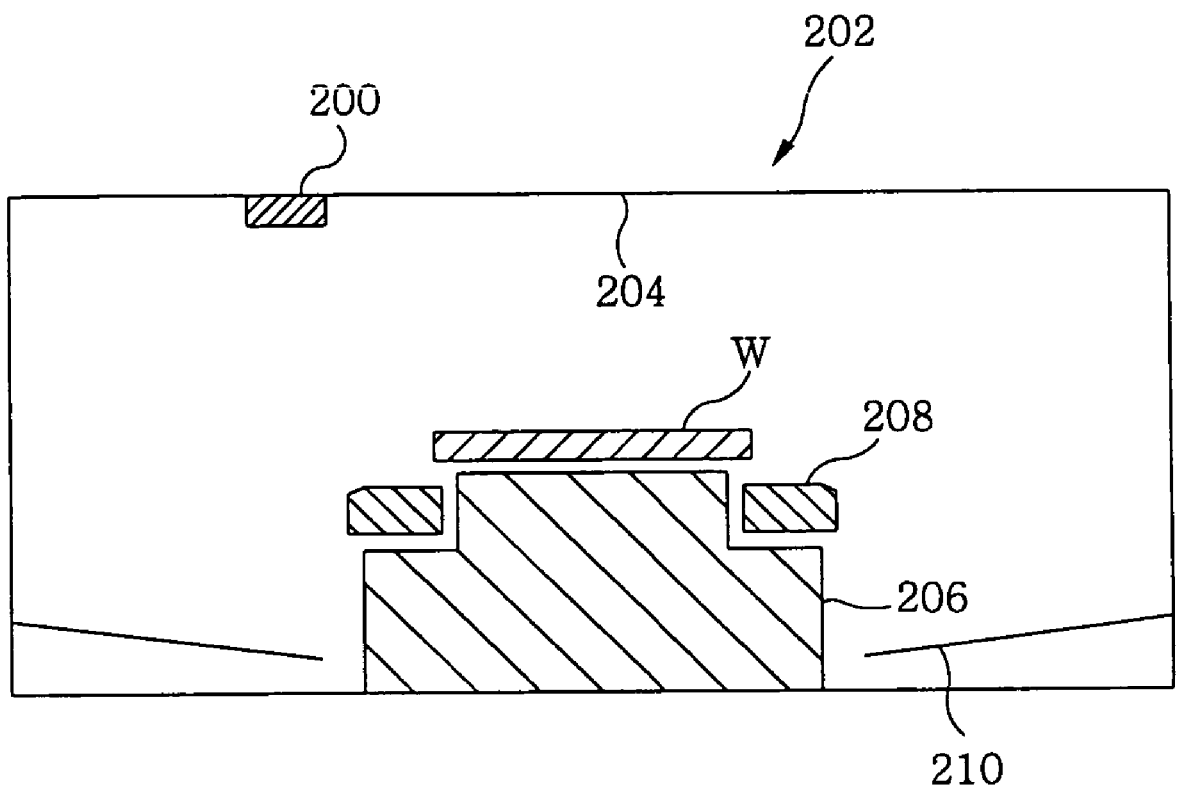
FIG. 3 represents a schematic cross sectional view of an experimental apparatus for analyzing deposits attached on a surface of a chip of yttrium oxide after a dry cleaning process in accordance with a preferred embodiment of the present invention.

Experiments carried out to examine a variation of etching rate of the dry cleaning process will now be described. Specifically, a chip 200 was prepared first by thermally spraying yttrium oxide ($Y_2O_3$) on a surface of an Al member whose material was identical with that of the chamber 102 used in the preferred embodiment of the present invention and the chip 200 was placed in an experimental chamber 202 shown in FIG. 3 in which a dry cleaning process was carried out under the processing condition described below. After the dry cleaning process, the components of the deposits attached on the surface of the chip 200 were examined by X-ray photoelectron spectroscopy (XPS). The chip 200 is fixed on a ceiling portion 204 of the experimental chamber 202 by using a silicone tape (not shown) which has a good thermal conductivity.

As in the plasma processing apparatus 100 used in the preferred embodiment of the invention, a wafer W was mounted on a supporting table 206 and a focus ring 208 was disposed around an upper periphery of the supporting table 206 to concentrate plasma in a processing space S. The focus ring 208 was made of a conductive material, e.g., single crystal silicon. Installed on the lower portion of the experimental chamber 202 was a baffle plate 210.

In the experiments, XPS was used to analyze the components of deposits attached on the surface of the chips 200 obtained in the experimental chamber 202 under 3 processing conditions as follows:

(1) a dry cleaning process for 15 minutes, (2) a dry cleaning process for 15 minutes and, then, a depoless-process for 25 minutes, and (3) a dry cleaning process for 15 minutes after adding a small amount of $CF_4$.

Figure 4:
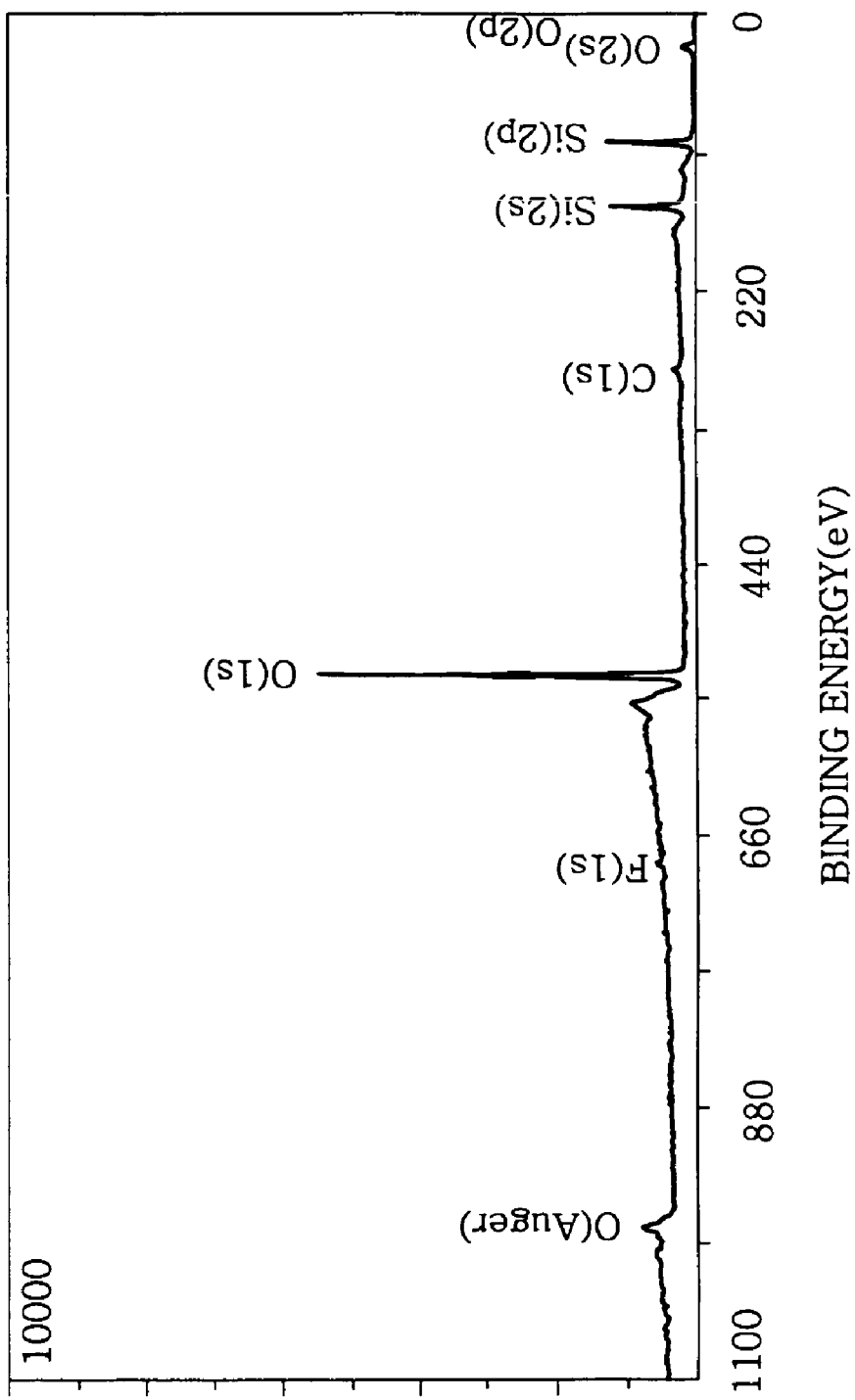
FIG. 4 outlines an XPS analysis on a surface of a chip of yttrium oxide to analyze deposits attached on the surface of the chip of yttrium oxide after a conventional dry cleaning process.

FIGS. 4, 5 and 6 illustrate experimental results under the above processing conditions (1), (2) and (3), respectively. In FIGS. 4 to 6, vertical axis represents the intensity of photoelectron (arbitrary unit) and the horizontal axis represents the binding energy (in eV).

All the dry cleaning processes in the experiments under an exemplary processing condition below:

a pressure in the experimental chamber 202; 100 mTorr, a high frequency power applied to the bottom electrode and time during which the high frequency power is applied; 2000 W and 1 minute, respectively, a flow rate of $O_2$ gas supplied as the process gas; 700 sccm, temperatures of the top electrode, the sidewall of the chamber and the bottom electrode; 60° C., 60° C. and 40° C., respectively, and pressure levels of a backgas (He); 7 Torr in the central region of an object to be processed and 40 Torr in the peripheral region thereof. Silicon dummy wafers were used in the dry cleaning process.

The depoless-process in the processing condition (2) was executed under a processing condition as follows:

a pressure in the chamber; 45 mTorr, a high frequency power applied to the bottom electrode and time during which the high frequency power is applied; 1400 W and 1 minute, respectively, flow rates of $CF_4$, $O_2$ and Ar gases in a mixed gas thereof supplied as the process gas; 80 sccm, 20 sccm and 160 sccm, respectively, temperatures of the top electrode, the sidewall of the chamber and the bottom electrode; 60° C., 60° C. and 40° C., respectively, and pressure levels of a backgas (He); 7 Torr in the central region of an object to be processed and 40 Torr in the peripheral region thereof.

In the processing condition (3), a $CF_4$ gas is provided at a flow rate of 2 sccm along with an $O_2$ gas. The $CF_4$ gas used herein serves to etch the silicon dummy wafer.

In the analysis of the XPS employed in the experiments, a peak of photoelectron intensity is detected at a specific binding energy of an element being analyzed. Thereafter, it can be deduced that the element whose peak appears in the XPS data is attached on the surface of the chip 200.

FIG. 4 illustrates an analysis result on the surface of the chip 200 prepared under the processing condition (1), which shows peaks of photoelectron intensity, especially for the oxygen element O and the silicon element Si.

FIG. 5 illustrates an analysis result on the surface of the chip 200 under the processing condition (2), which shows peaks of photoelectron intensity, especially for the fluorine element F and the yttrium element Y.

FIG. 6 illustrates an analysis result on the surface of the chip 200 under the processing condition (3), which shows peaks, especially for the fluorine element F and the yttrium element Y as in the processing condition (2).

Since the surfaces of the chips 200 analyzed by XPS are formed of yttrium oxide ($Y_2O_3$), peaks of photoelectron intensity corresponding to the yttrium element Y and the oxygen element O should be detected by the XPS analysis if the chip surfaces are not covered by deposits.

However, under the processing condition (1), there is no peak of photoelectron intensity corresponding to yttrium element Y, but there is shown a peak of photoelectron intensity corresponding to silicon element Si. Therefore, under the processing condition (1), it is believed that silicon sputter materials including silicon oxide $SiO_2$ are attached on the surface of the chip 200.

Under the processing condition (2), there is shown a peak of photoelectron intensity corresponding to fluorine element F, instead of oxygen element O, and there is no peak of photoelectron intensity corresponding to silicon element Si. Therefore, under the processing condition (2), it is believed that the surface of the chip 200 is fluorinated so that the silicon sputter materials are removed by the depoless-process.

Under the processing condition (3), there is shown a peak of photoelectron intensity corresponding to fluorine element F, instead of oxygen element O, and there is no peak of photoelectron intensity corresponding to silicon element Si. Therefore, under the processing condition (3), it is believed that the surface of the chip 200 is fluorinated and there is no deposits of silicon sputter materials.

Figure 7A:
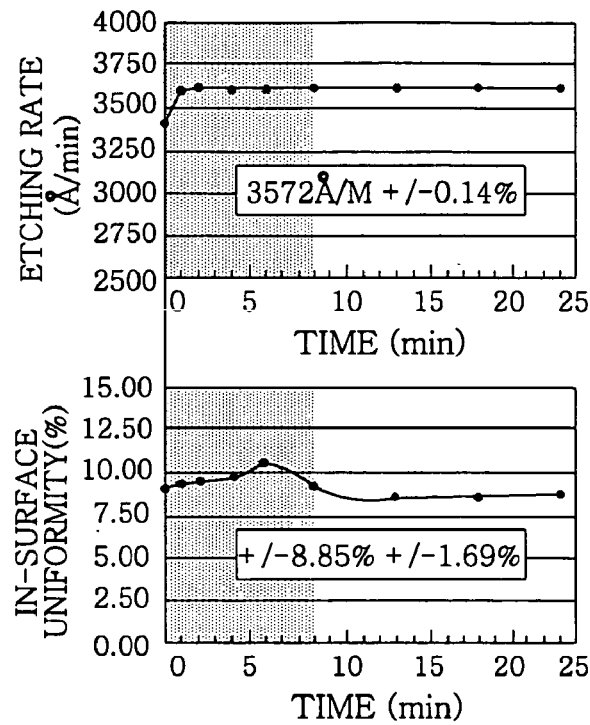
FIGS. 7A to 7C present graphic illustration explaining variations of etching rate and in-surface uniformity of etching rate during the depoless-process after carrying out conventional dry cleaning process and a dry cleaning process in accordance with the present invention for 30 minutes.
Figure 7B:
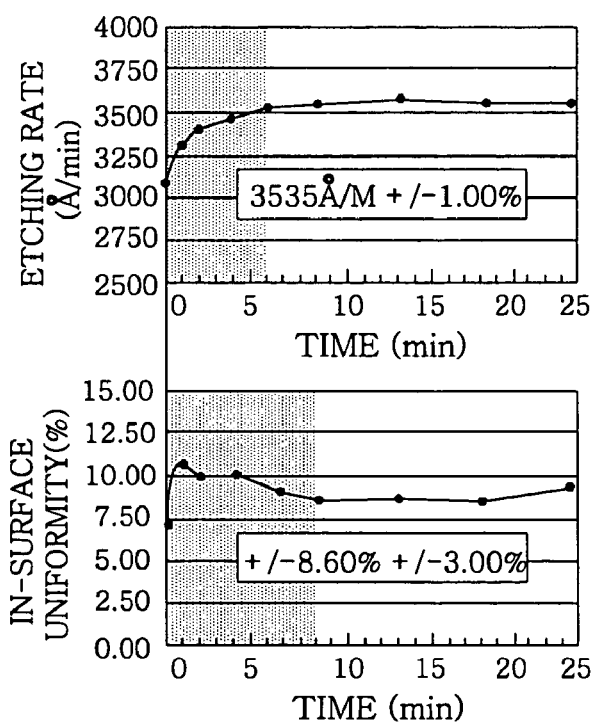
Figure 7C:
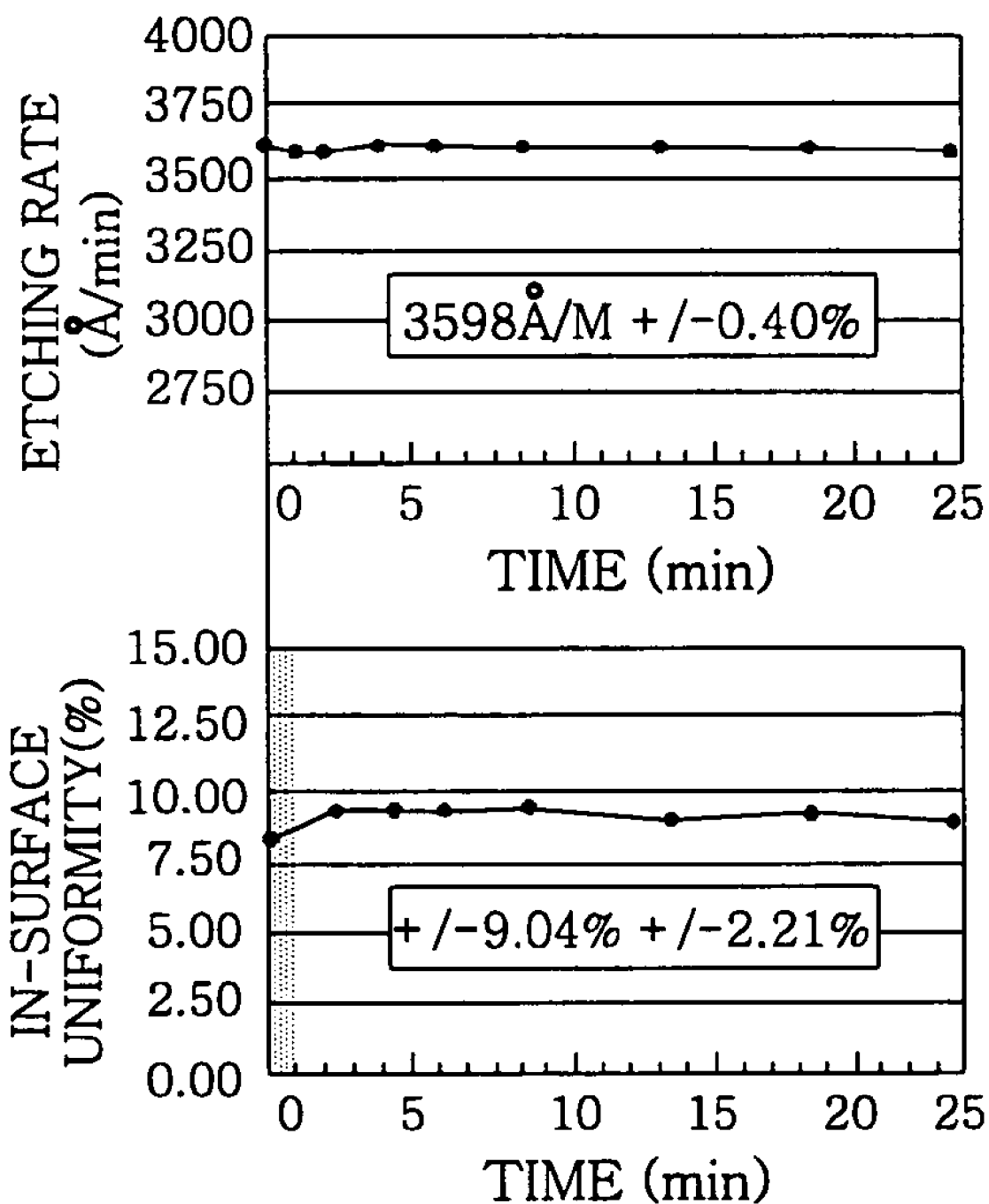
Figure 8A:
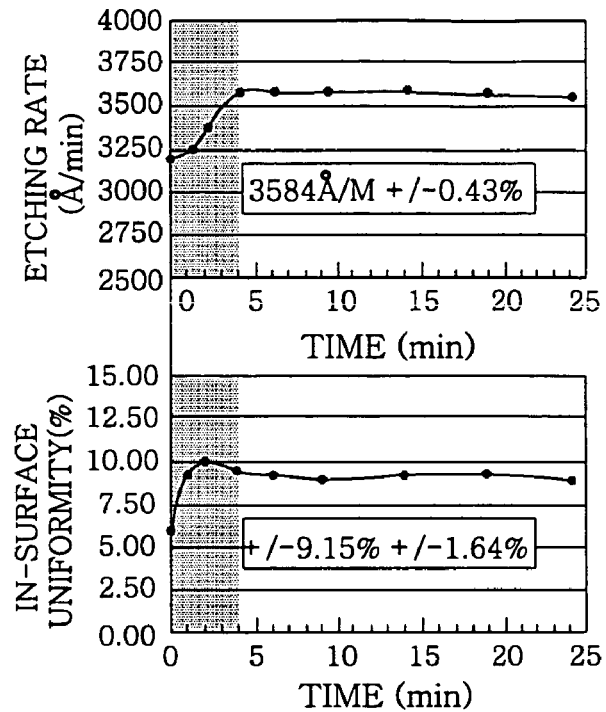
FIGS. 8A to 8D explain graphic illustration explaining the examination results of variations of etching rate and in-surface uniformity of etching rate during a depoless-process after a dry cleaning process in accordance with the present invention is performed while varying an added amount of $CF_4$.
Figure 8B:
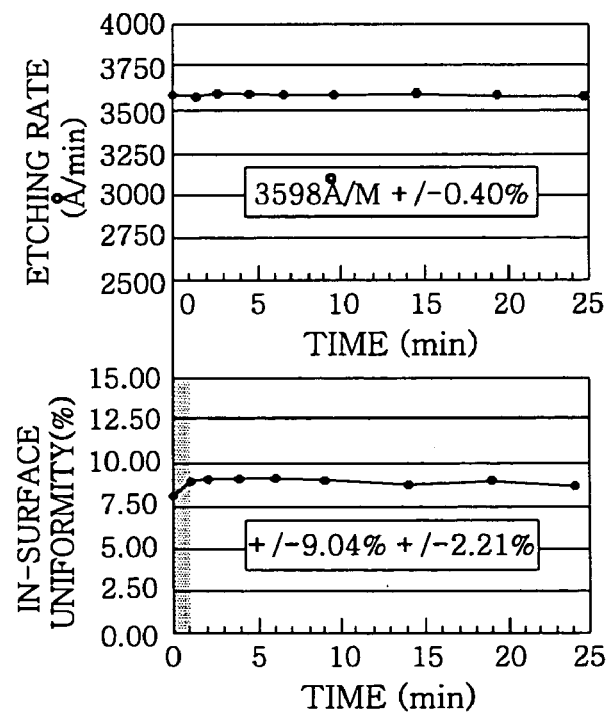
Figure 8C:
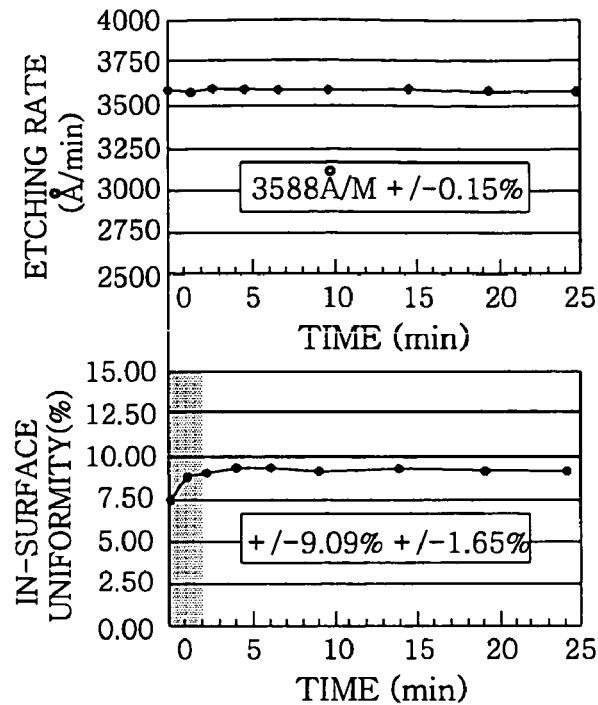
Figure 8D:
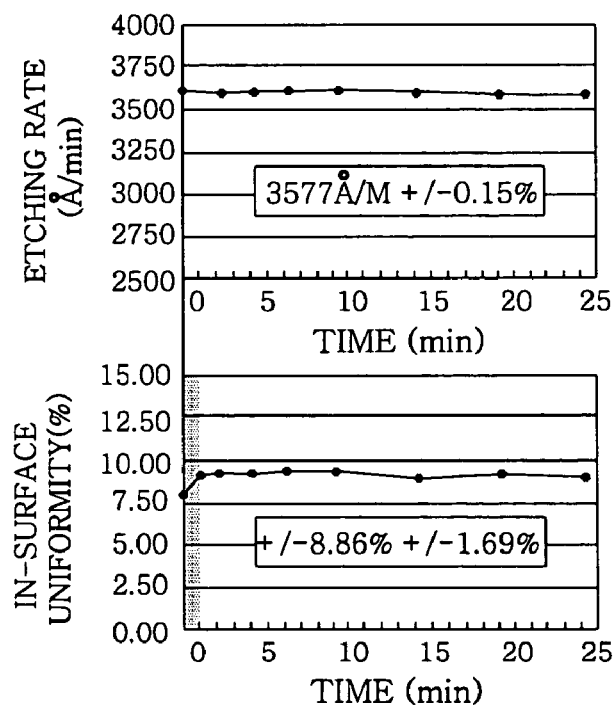

Referring to FIGS. 7A to 7C, there are shown influences on variations in the etching rate and the in-surface uniformity of etching rate due to an additional amount of $CF_4$ added during the dry etching process.

FIGS. 7A to 7C are graphic illustration explaining variations in the etching rate and those in the in-surface uniformity of etching rate for cases where 25 wafers were treated with the depoless-process as shown in the previous embodiment after being treated by the dry cleaning process for 30 minutes. The vertical axes in graphs on the upper side represent an etching rate (Å/min); those on the lower side, an in-surface uniformity of etching rate (%); and the horizontal axes, an elapsed time (min) measured from the time of the termination of the dry cleaning process. The processing time of the depoless-process is about 1 minute per a wafer W and the number in the horizontal axes corresponds to the number of wafers processed by the depoless-process.

FIGS. 7A to 7C correspond to cases of performing a dry cleaning process for 15 minutes, a dry cleaning process for 15 minutes with a polyimide attached on a surface of a wafer and a dry cleaning process for 30 minutes with a small amount of $CF_4$ added (a flow rate of 2 sccm), respectively. Values shown in each graph denotes an average and a standard after the etching rate or the in-surface uniformity during the depoless-process reaches a stable range. The stable ranges were determined based on the criteria that the etching rates and the in-surface uniformities respectively remain within ±1.0% and ±3.0% with respect to an average of the etching rates and an average of the in-surface uniformities after reaching their respective stable regions. The dotted portions in FIGS. 7A to 7C represent unstable regions.

An exemplary processing condition of the depoless-process for plasma-etching a thermal silicon oxide film formed all over the surface of the wafer, i.e., an object to be processed, with a diameter of 200 mm is processed by plasma etching is as follows:

a pressure in the chamber; 45 mTorr, a high frequency power applied to the bottom electrode and time during which the high frequency power is applied; 1400 W and 1 minute, respectively, flow rates of $CF_4$, $O_2$ and Ar gases in a mixed gas thereof supplied as the process gas; 80 sccm, 20 sccm and 160 sccm, respectively, temperatures of the top electrode, the sidewall of the chamber and the bottom electrode; 60° C., 60° C. and 40° C., respectively, and pressure levels of the backgas (He); 7 Torr in a central region of the object to be processed and 40 Torr in a peripheral region thereof.

Further, an exemplary processing condition for the dry cleaning process were as follows:

a pressure in the chamber; 100 mTorr, a high frequency power applied to the bottom electrode and time during which the high frequency power is applied; 2000 W and 1 minute, respectively, a flow rate of $O_2$ gas supplied as the process gas; 700 sccm, temperatures of the top electrode, the sidewall of the chamber and the bottom electrode; 60° C., 60° C. and 40° C., respectively, and pressure levels of a backgas (He); 7 Torr in the central region of the object to be processed and 40 Torr in the peripheral region thereof. The silicon dummy wafers were used during the dry cleaning process.

FIG. 7A illustrates a case for performing dry cleaning process for 30 minutes. As soon as the dry cleaning process was terminated after 30 minutes, the etching rate dropped and it took 9 minutes for the etching rate and the in-surface uniformity of etching rate to be stabilized. FIG. 7B illustrates a case for performing dry cleaning process for 30 minutes on a wafer with a polyimide film attached on surface thereof. As soon as the dry cleaning process was terminated after 30 minutes, the etching rate also dropped and the stabilization time for the etching rate reduced to 6 minutes. Further, it took 9 minutes for the in-surface uniformity to be stabilized. From this, it is speculated that the silicon wafer with the surface thereof coated with a polyimide film suppresses the generation and accumulation of silicon sputter materials. FIG. 7C illustrates a case for performing dry cleaning process for 30 minutes with a small amount of $CF_4$ (a flow rate of 2 sccm) added. After the dry cleaning process is completed, the etching rate did not drop and remained approximately constant. The in-surface uniformity reduced slightly but it takes 1 minute for the in-surface uniformity to be stabilized.

From the experimental results described above, it is evident that the decrease of the etching rate in the depoless-process right after the dry cleaning process largely resulted from the silicon sputter materials such as silicon oxide attached in the chamber during the dry cleaning process.

Further, it appears that the accumulation of silicon sputter materials is suppressed and therefore the drop of the etching rate in the depoless-process right after the dry cleaning process is also suppressed, by adding a small amount of $CF_4$ functioning to etch the silicon dummy wafer during the dry cleaning process.

FIGS. 8A to 8D illustrate results to examine an appropriate amount of $CF_4$ to be added in the dry cleaning process to obtain the effects described above.

FIGS. 8A to 8D are graphic illustrations explaining variations in the etching rate and those in the in-surface uniformity (%) of etching rate for cases where 25 sheets of wafers treated with the depoless-process as shown in the previous embodiment after being treated by the dry cleaning process for 30 minutes. The vertical axes in graphs on the upper side represent an etching rate (Å/min); those on the lower side, an in-surface uniformity of etching rate (%); and the horizontal axes, an elapsed time (min) measured from the time of the termination of the dry cleaning process. The processing time of the depoless-process is about 1 minute per a wafer W and the number in the horizontal axes corresponds to the number of wafers processed by the depoless-process.

FIGS. 8A to 8D correspond to cases of performing a dry cleaning process for 30 minutes in which $CF_4$ is added with the flow rates of 0.4 sccm, 2 sccm, 10 sccm and 50 sccm, respectively. Values shown in each graph denotes an average and a standard deviation of an etching rate or an in-surface uniformity after the etching rate or the in-surface uniformity during the depoless-process reaches a stable range. The stable ranges were determined based on the criteria that the etching rates and the in-surface uniformities respectively remain within ±1.0% and ±3.0% with respect to an average of the etching rates and an average of the in-surface uniformities after reaching their respective stable regions. The dotted portions in FIGS. 8A to 8D represent unstable regions.

An exemplary processing condition of the depoless-process for plasma-etching a thermal silicon oxide film formed all over the surface of the wafer, i.e., an object to be processed, with a diameter of 200mm is processed by plasma etching is as follows:

a pressure in the chamber; 45 mTorr, a high frequency power applied to the bottom electrode and time during which the high frequency power is applied; 1400 W and 1 minute, respectively, flow rates of $CF_4$, $O_2$ and Ar gases in a mixed gas thereof supplied as the process gas; 80 sccm, 20 sccm and 160 sccm, respectively, temperatures of the top electrode, the sidewall of the chamber and the bottom electrode; 60° C., 60° C. and 40° C., respectively, and pressure levels of the backgas (He); 7 Torr in a central region of the object to be processed and 40 Torr in a peripheral region thereof.

Further, an exemplary processing condition for the dry cleaning process were as follows:

a pressure in the chamber; 100 mTorr, a high frequency power applied to the bottom electrode and time during which the high frequency power is applied; 2000 W and 1 minute, respectively, a flow rate of $O_2$ gas supplied as the process gas; 700 sccm, temperatures of the top electrode, the sidewall of the chamber and the bottom electrode; 60° C., 60° C. and 40° C., respectively, and pressure levels of a backgas (He); 7 Torr in the central region of the object to be processed and 40 Torr in the peripheral region thereof. The silicon dummy wafers were used during the dry cleaning process.

Referring to FIGS. 8A to 8D, when the flow rate of $CF_4$ added during the dry cleaning process was 0.4 sccm, it was observed that the etching rate and the in-surface uniformity of etching rate dropped and it took 4 minutes the etching rate and the in-surface uniformity of etching rate to be stabilized. When the flow rate of $CF_4$ was not less than 2 sccm, the etching rate did not drop; and the in-surface uniformity reduced slightly but it took 1 to 2 minutes for in-surface uniformity of etching rate to be stabilized. Thus, it is clear that the drop of the etching rate after the dry cleaning process can be suppressed if the oxygen gas and $CF_4$ are simultaneously supplied at flow rates of 700 sccm and not less than 2 sccm during the dry cleaning process, respectively.

However, if a flow rate of $CF_4$ becomes unnecessarily large, all parts in the plasma processing apparatus may be rusted. Therefore, the ratio of flow rate of oxygen to that of $CF_4$ during the dry cleaning process is preferably not less than 1 sccm/700 sccm (about 0.14%) but not greater than 50 sccm/700 sccm (about 7.1%), and more preferably not less than 2 sccm/700 sccm (about 0.29%) but not greater than 10 sccm/700 sccm (about 1.4%).

Figure 9:
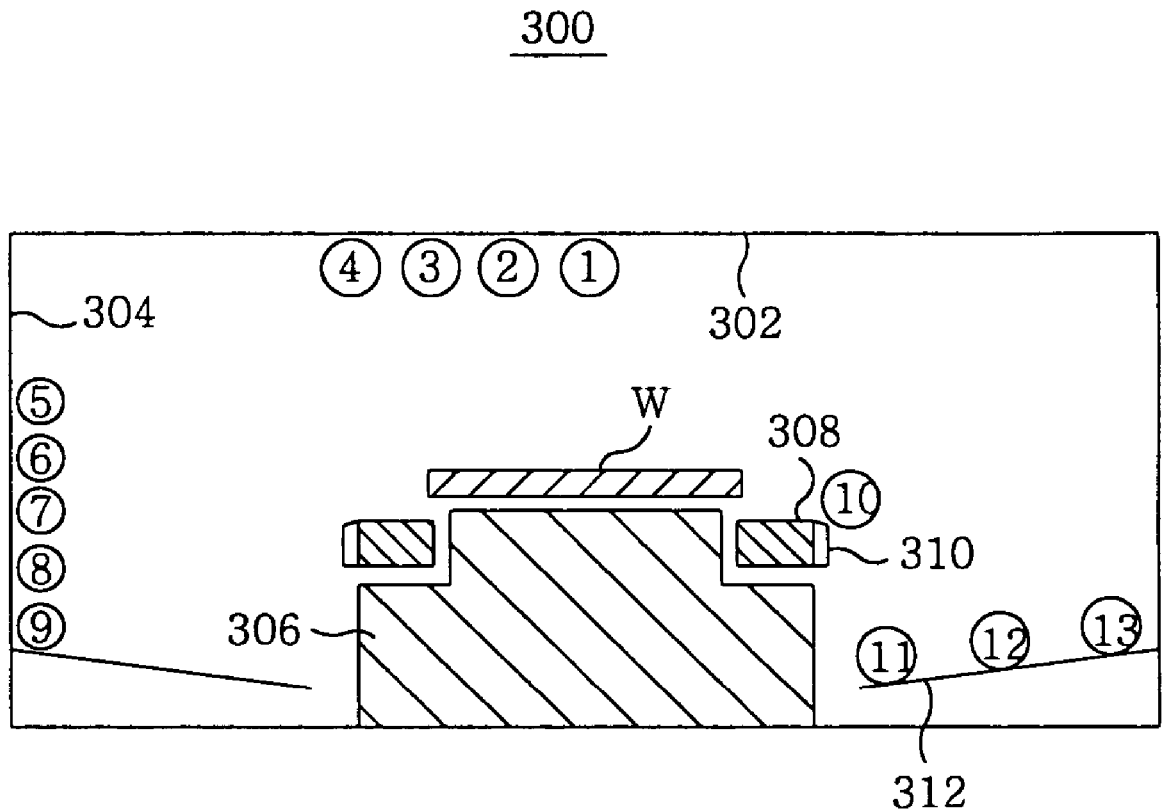
FIG. 9 depicts a schematic cross sectional view of an experimental apparatus for examining variations of etching rate depending on a variety of conditions applied during the dry cleaning process.

Another experiment performed to examine a dependence of the variations of the etching rate on other conditions during the dry cleaning process will be described. As shown in FIG. 9, a plurality of resist chips were attached on a ceiling plate 302, a sidewall (deposition shield) 304, an insulator ring 310 and a baffle plate 312 of an experimental chamber 300 by using a silicone tape (not shown) having a good thermal conductivity. And then the dry cleaning process was performed under various conditions to examine a dependence of a variation of an ashing rate and an ashing time on (1) the presence of $CF_4$ added (when added, a $CF_4$ flow rate was 2 sccm) and (2) a magnitude of power applied to the bottom electrode.

A wafer W was mounted on a supporting table 306 in the experimental chamber 300 and a focus ring 308 was disposed around an upper periphery of the supporting table 306 to converge plasma in a processing space S. The focus ring 308 was made of a conductive material, e.g., single crystalline silicon. Installed around the outer periphery of the focus ring 308 was an insulator ring 310 of, e.g., silicon oxide. Installed around the lower portion of the experimental chamber 300 was a baffle plate 312.

As shown in FIG. 10, the resist chips were attached on the following portions inside the experimental chamber 300:

① on a central portion of a ceiling plate corresponding to a portion right above the central port of the wafer W, ② on a portion of the ceiling plate located 50mm apart from the central portion thereof, ③ on a portion of the ceiling plate located 95mm apart from the central portion thereof, ④ on a portion of the ceiling plate located 140mm apart from the central portion thereof, ⑤ on a portion of the deposition shield located 50mm apart (near the top thereof) from the bottom surface of the experimental chamber, ⑥ on a portion of the deposition shield located 40mm apart from the bottom surface of the experimental chamber, ⑦ on a portion of the deposition shield located 30mm apart from the bottom surface of the experimental chamber, ⑧ on a portion of the deposition shield located 20mm apart from the bottom surface of the experimental chamber, ⑨ on a portion of the deposition shield located 10mm apart (near the bottom thereof) from the bottom surface of the experimental chamber, ⑩ on the insulator ring, ⑪ on the baffle plate near the supporting table, ⑫ on the baffle plate at the center thereof, and ⑬ on the baffle plate near the sidewall.

In order to examine the influence due to an addition of $CF_4$ (with a flow rate of 2 sccm when added), the dry cleaning process was performed under the following condition:

a pressure in the chamber 300; 100 mTorr, a high frequency power applied to the bottom electrode and time during which the high frequency power is applied; 1500 W and 1 minute, respectively, flow rate of $O_2$ supplied as the process gas; 700 sccm, temperatures of the top electrode, the sidewall of the chamber and the bottom electrode; 60° C., 60° C. and 40° C., respectively, and pressure levels of a backgas (He); 7 Torr at the central region of the object to be processed and 40 Torr at the peripheral region thereof.

In order to examine the influence due to a variation in a magnitude of power applied to the bottom electrode, the dry cleaning process was performed under the following condition:

a pressure in the chamber 300; 100 mTorr, a high frequency power applied to the bottom electrode and time during which the high frequency power is applied; 1500 W and 1 minute, respectively, a ratio of flow rate of $O_2$ gas to that of $CF_4$ gas supplied as the process gas; 700 sccm/2 sccm, temperatures of the top electrode, the sidewall of the chamber and the bottom electrode; 60° C., 60° C. and 40° C., respectively, and a pressure range of a backgas (He); 7 Torr at the central region of the object to be processed and 40 Torr at the peripheral region thereof.

FIG. 10 is a table of the result of the experiment 1) describing a relationship between the presence of $CF_4$ added and the ashing rate (Å/min) at each location in the experimental chamber 300. As can be seen from FIG. 10, all the maximum (Max.), the minimum (Min.), the average (Ave.) and the uniformity (Unif.) of the ashing rate do not vary much regardless of whether a small amount of $CF_4$ is added or not. The uniformity (Unif.) is defined by (Max.−Min.)/(2×Ave.)×100. Since there are no significant variations in the ashing rate of the resist due to the addition of $CF_4$, it may be deduced that there will be no significant variations in the etching rate due to the addition of $CF_4$ as well.

FIG. 11 is a table of the result of the experiment 2) describing a relationship between a power (W) applied to the bottom electrode and time (second) required to remove the deposits attached to the resist chip at each location in the experimental chamber 300 after completing the depo-process for 25 wafers with a processing time of 3 min/wafer. The powers applied to the bottom electrode were 500 W, 1000 W and 1500 W, respectively.

As can be seen from FIG. 11, all of a maximum (Max.), a minimum (Min.) and an average (Ave.) of the ashing time required for ashing are reduced at each location of the experimental chamber as the power applied to the electrode increases from 500 W to 1500 W. Accordingly, it may be deduced that the ashing rate increases in proportion to the power applied to the bottom electrode.

However, if the applied power increases from 500 W to 1000 W, an uniformity (Unif.) in time required for ashing reduces. On the other hand, if the applied power increases from 1000 W to 1500 W, the uniformity in time required for ashing slightly increases from 116.68 to 117.92. Accordingly, it can be deduced that, if the power applied to the bottom electrode is larger than a certain value, the uniformity of the ashing rate is deteriorated. The uniformity (Unif.) is (Max.−Min.)/(2×Ave.)×100.

If the high frequency power applied to the bottom electrode is excessively increased, the temperature in the experimental chamber 300 also excessively increases, which would affect each part in the plasma processing apparatus 100.

Therefore, in case of the apparatus having the configuration described above, it is preferable that the power applied to the bottom electrode ranges from 1000 W to 1500 W (from about 3.18 $W/cm^2$ to about 4.78 $W/cm^2$) during the ashing process on the resist chips. Therefore, it is also preferable that the applied power during the etching process is identical to the power range described above.

Through the repeated experiments on the dry cleaning process of the plasma processing, it has been found that by supplying both a deposit removing gas including $O_2$ and a dummy wafer etching gas (dummy substrate etching gas) including $CF_4$ into the chamber, a deposition film, e.g., a silicon sputter materials, is prevented from being deposited on a, e.g., sidewall in the plasma processing apparatus.

Figure 12A:
FIG. 12A is a flow chart of a plasma processing method in accordance with the present invention.
Figure 12B:
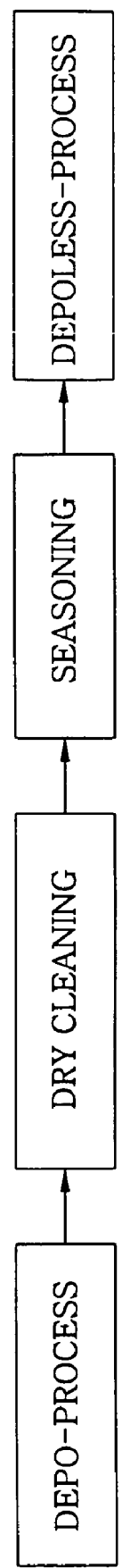
FIG. 12B is a flow chart of a conventional plasma processing method.

Accordingly, as shown in FIGS. 12A and 12B, the dry cleaning process of the plasma processing in accordance with the present invention is different from the conventional dry cleaning process. Specifically, the dry cleaning process of the present invention is performed with a small amount of $CF_4$ added in the process gas. Therefore, the dry cleaning process of the present invention does not require a seasoning process thereafter and, thus, additional efforts and time for the seasoning process can be saved and a series of plasma processes can be realized with an improvement in operating rate thereof.

Even though the preferred embodiments of the present invention have been described in conjunction with the accompanying drawings, the present invention is not limited thereto.

Even though, for example, the etching is described as the plasma processing in preferred embodiments of the invention, the plasma processing is not limited to the etching. Rather, same effects may be achieved in other plasma processing, e.g., ashing, sputtering and the like, if deposits including silicon sputter materials have an adverse effect on the plasma processing.

Further, even though a small amount of $CF_4$ is used as the dummy wafer etching gas (dummy substrate etching gas) added to the deposit removing gas during the dry etching process in accordance with the preferred embodiments of the invention, any other gas capable of etching the wafer by reacting with it may be used as the dummy wafer etching gas. Specifically, a CF based gas other than $CF_4$, a CHF based gas or a SF based gas may be used as the dummy wafer etching gas.

Furthermore, though $O_2$ is used as the deposit removing gas during the dry etching process in accordance with the preferred embodiment of the present invention, any other gas may be used as the deposit removing gas as long as such gas is capable of forming a compound to be evaporated with a high vapor pressure by reacting with the deposits of the deposition film to be eliminated. Specifically, a nitrogen gas, a hydrogen gas, an ammonia gas or a mixed gas of a combination thereof may be used as the deposit removing gas.

Moreover, though the high frequency power is applied to the bottom electrode, i.e., the supporting table, and the top electrode, i.e., the shower head, is grounded in the embodiments of the present invention, the same effects may be obtained in case the high frequency power is applied to the top electrode, i.e., the shower head, and the bottom electrode, i.e., the supporting table, is grounded.

Since the deposits such as silicon sputter materials are prevented from being accumulated on the wall inside the chamber during the dry cleaning process in accordance with the present invention as described above, the etching rate can be prevented from being dropped right after the dry cleaning process. As a result, the conventional seasoning process carried out right after the dry cleaning process in order to execute the depoless-process becomes unnecessary and the additional effects and time for the seasoning process may be eliminated, enabling a series of plasma processes to be realized with an improvement in the operating rate thereof.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing method having a first and a second plasma processing step carried out in a single chamber, wherein deposits are substantially accumulated in the chamber during the first plasma processing step, the method comprising the steps of:

dry cleaning an inside of the chamber by using a dummy substrate between the first and the second plasma processing steps, wherein the dry cleaning step is performed by supplying into the chamber a deposit removing gas for removing the deposits produced in the chamber during the first plasma processing step and supplying a dummy substrate etching gas that etches the dummy substrate and stabilizes an etching rate of the second plasma processing step, which is carried out right after the dry cleaning step, wherein the second plasma processing step includes a plasma etching performed without producing deposits in the chamber, and wherein a first CF-based gas is supplied in the first plasma processing step, and a second CF-based gas comprising $CF_4$, $O_2$, and Ar is supplied in the second plasma processing step, and the first CF-based gas has a different composition from the second CF-based gas such that a fluorine/carbon (F/C) ratio of the first CF-based gas is smaller than that of the second CF-based gas.

2. The plasma processing method of claim 1, wherein the deposit removing gas is an oxygen gas, a nitrogen gas, a hydrogen gas, an ammonia gas or a combination thereof.

3. The plasma processing method of claim 1, wherein the dummy substrate etching gas is one of a CF-based gas, a CHF-based gas and a SF-based gas.

4. The plasma processing method of claim 1, wherein the deposit removing gas is an oxygen gas and the dummy substrate etching gas is $CF_4$.

5. The plasma processing method of claim 1, wherein a surface of the dummy substrate is made of a material having silicon.

6. The plasma processing method of claim 1,
wherein the supplying the first CF-based gas includes supplying $C_4F_8$,
wherein the supplying the deposit removing gas and supplying the dummy substrate etching gas in the dry cleaning step includes supplying $O_2$ and $CF_4$, respectively.

7. The plasma processing method of claim 1,
wherein the first and the second plasma processing steps and the dry cleaning step are carried out without a seasoning step occurring between the dry cleaning and the second plasma processing step.

8. The plasma processing method of claim 6,
wherein the first CF-based gas, supplied in the first plasma processing step, consists of $C_4F_8$,
wherein the deposit removing gas supplied in the dry cleaning step consists of $O_2$, and the dummy substrate etching gas consists of $CF_4$, and
wherein the second CF-based gas, supplied in the second plasma processing step, consists of $CF_4$, $O_2$, and Ar.

9. The plasma processing method of claim 8, wherein the deposit removing gas consisting of $O_2$ is supplied at a flow rate of at least 700 sccm, and the dummy substrate etching gas consisting of $CF_4$ is supplied at a flow rate of at least 2 sccm.

10. A plasma processing method comprising the sequential steps of:
performing a first plasma etching step in a chamber, during which deposits are produced and accumulated in the chamber;
dry cleaning an inside of the chamber by using a dummy substrate; and performing a second plasma etching step without producing deposits in the chamber,
wherein the dry cleaning step is performed by supplying into the chamber a deposit removing gas for removing the deposits and a dummy substrate etching gas that etches the dummy substrate and stabilizes an etching rate of the second plasma etching step carried out right after the dry cleaning step,
wherein a ratio of a flow rate of the dummy substrate etching gas to that of the deposit removing gas is not less than about 0.14% but not larger than about 7.1%, and
wherein a first CF-based gas is used in the first plasma etching step, and a second CF-based gas comprising $CF_4$, $O_2$, and Ar is used in the second plasma etching step, and the first CF-based gas has a different composition from the second CF-based gas such that a fluorine/carbon (F/C) ratio of the first CF-based gas is smaller than that of the second CF-based gas.

11. The plasma processing method of claim 10, wherein a high frequency power applied to one of a top and a bottom electrode during the step of dry cleaning ranges from about 3.18 $W/cm^2$ to about 4.78 $W/cm^2$.

12. The plasma processing method of claim 10, wherein the deposit removing gas is an oxygen gas, a nitrogen gas, a hydrogen gas, an ammonia gas or a combination thereof.

13. The plasma processing method of claim 10, wherein the dummy substrate etching gas is one of a CF-based gas, a CHF-based gas and a SF-based gas.

14. The plasma processing method of claim 10, wherein the deposit removing gas is an oxygen gas and the dummy substrate etching gas is $CF_4$.

15. The plasma processing method of claim 10, wherein a surface of the dummy substrate is made of a material having silicon.

16. The plasma processing method of claim 10, wherein the ration of the flow rate of the dummy substrate etching gas to that of the deposit removing gas is not less than about 0.29%, but not larger than about 1.4%.

17. The plasma processing method of claim 10,
wherein the supplying the first CF-based gas includes supplying $C_4F_8$,
wherein the supplying the deposit removing gas and supplying the dummy substrate etching gas in the dry cleaning step includes supplying $O_2$ and $CF_4$, respectively.

18. The plasma processing method of claim 10,
wherein the first and the second plasma etching steps and the dry cleaning step are carried out without a seasoning step occurring between the dry cleaning and the second plasma processing step.

19. The plasma processing method of claim 17,
wherein the first CF-based gas, supplied in the first plasma etching step, consists of $C_4F_8$,
wherein the deposit removing gas supplied in the dry cleaning step consists of $O_2$, and the dummy substrate etching gas consists of $CF_4$, and
wherein the second CF-based gas, supplied in the second plasma etching step, consists of $CF_4$, $O_2$, and Ar.

20. The plasma processing method of claim 19, wherein the deposit removing gas consisting of $O_2$ is supplied at a flow rate of at least 700 sccm, and the dummy substrate etching gas consisting of $CF_4$ is supplied at a flow rate of at least 2 sccm.

* * * * *